United States Patent
Brown et al.

(10) Patent No.: US 6,362,430 B1
(45) Date of Patent: Mar. 26, 2002

(54) INTEGRATED CABLE MANAGEMENT AND EQUIPMENT MOUNTING DEVICE

(75) Inventors: Reed S. Brown, Indianapolis; Ronald W. Kohl, Jr., Fishers, both of IN (US); John A. Rutkowski, Jackson, NJ (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 09/268,511

(22) Filed: Mar. 12, 1999

(51) Int. Cl.[7] ................................................ H02G 3/04
(52) U.S. Cl. ........................ 174/97; 174/101; 248/49; 248/68.1
(58) Field of Search ......................... 174/97, 95, 101, 174/50.52, 52.1, 59; 248/49, 68.1

(56) References Cited

U.S. PATENT DOCUMENTS

| | | | |
|---|---|---|---|
| 5,134,250 A | * | 7/1992 | Caveney et al. ............ 174/101 |
| 5,274,194 A | * | 12/1993 | Belcher ........................ 174/50 |
| 5,286,919 A | * | 2/1994 | Benson et al. ................ 174/50 |
| 5,721,396 A | * | 2/1998 | Daoud .......................... 174/59 |
| 5,898,129 A | * | 4/1999 | Ott et al. ...................... 174/59 |
| 6,060,660 A | * | 5/2000 | Bauer ........................ 174/52.1 |

* cited by examiner

Primary Examiner—Dean A. Reichard
Assistant Examiner—W. David Walkenhorst
(74) Attorney, Agent, or Firm—Gibbons, Del Deo, Dolan, Griffinger & Vecchione

(57) ABSTRACT

An integrated cable management and equipment mounting device is disclosed for automatically providing cable management channels or troughs for a mounting surface removably attached to the device. A mounting member extends inwardly from the side walls defining a cable trough plane with the side wall. Additionally, each equipment mounting shelf or bracket has extending arms or members that form one or more "U" channels with the mounting element, thereby providing more cable troughs.

16 Claims, 5 Drawing Sheets

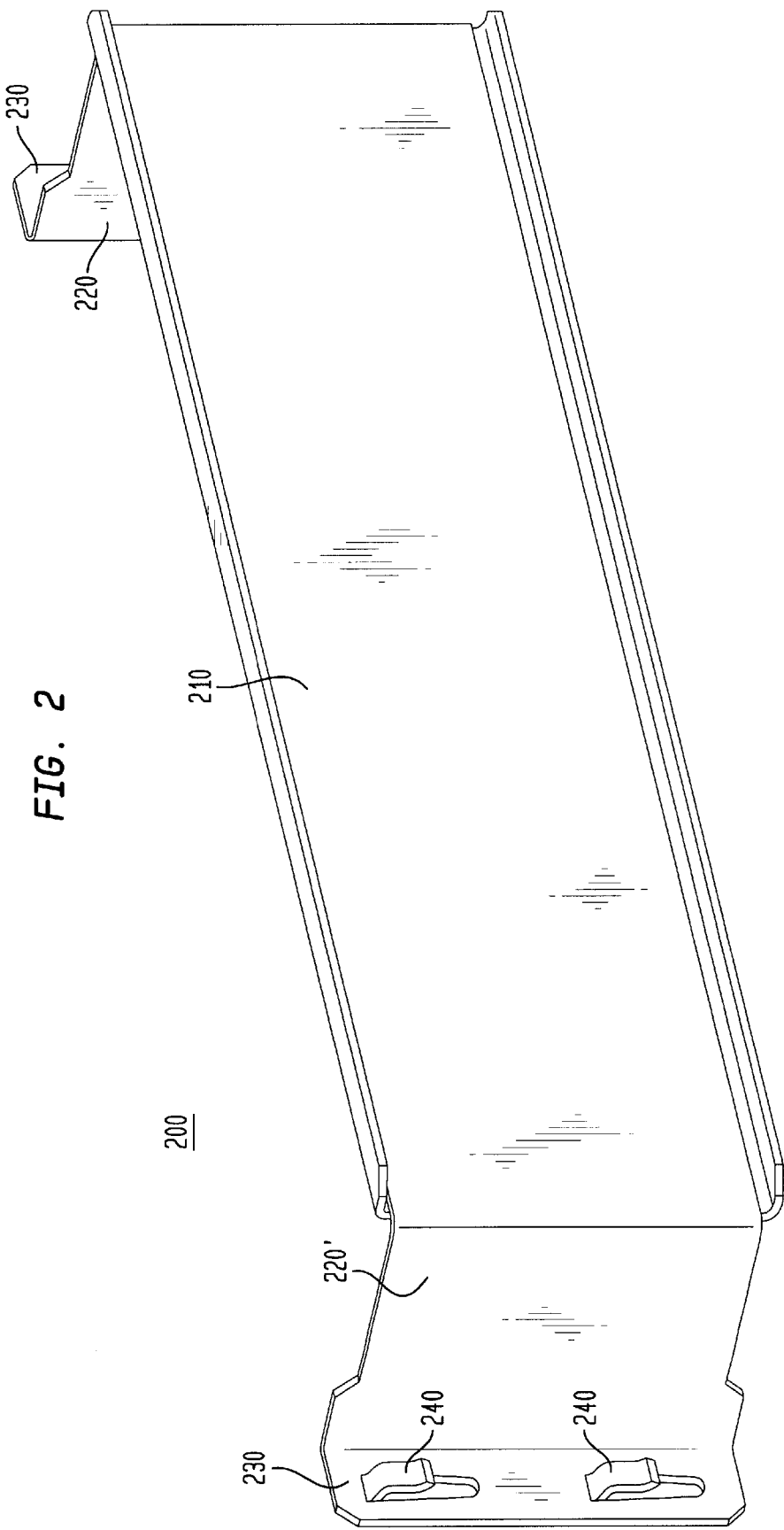

INTEGRATED CABLE MANAGEMENT AND EQUIPMENT MOUNTING DEVICE

FIELD OF THE INVENTION

This invention relates to the field of enclosures for electronic equipment, and particularly to the field of enclosures providing cable management for electronic equipment.

BACKGROUND OF THE INVENTION

Modern electronic systems often comprise many different subsystems and components. System components are typically mounted in enclosures designed for easy access. Since different systems have different types and sizes of equipment, each possibly requiring different types of cabling, such as twisted pair, shielded, coaxial, and optical, as well as different kinds of equipment to cable connections, it is desirable to provide enclosures usable with a wide range of equipment.

Various enclosures for electronic equipment are available. These enclosures typically provide mounting surfaces for the electronics and apertures for cabling to pass into the enclosure from the outside. A door is usually provided for access to the enclosed electronics. The enclosure may be constructed of steel, wood, plastic or a combination of materials, depending upon its intended use. In most known enclosures, no provision is made for cable management. The user of the enclosure is left to route cables as he or she desires, often resulting in criss-crossed cabling and an unsightly cable arrangement.

Other enclosures provide limited cable management, such as loops to secure cables with plastic tie wraps. While providing the ability to route cables, these systems are labor intensive. The user must manipulate the cables into position, apply the tie wraps, and secure the wraps to the provided loops. Often these enclosures still result in cables traversing across the electronics in an haphazard fashion, so that an individual desiring to install or replace electronics must move the cables before carrying out the intended task. This often requires undoing the tie wraps, performing the desired task, and then replacing the tie wraps.

It is another disadvantage of known cable management systems that they are fixed at the time of manufacture of the enclosure. A user of such an enclosure must route the cabling according to the design of the enclosure. When the design proves to be unsatisfactory, the user must either abandon the dedicated cable management or acquire another enclosure more suitable to the user's purpose.

Accordingly, there is a need to furnish an integrated cable and management equipment mounting device that can accommodate different types, shapes, and sizes of equipment, while automatically providing for cable management.

SUMMARY OF THE INVENTION

An enclosure according to the principles of the invention allows integrated cable management, by automatically providing a cable management area, or trough, between the equipment mounting surfaces and the walls of the enclosure. The enclosure comprises a mounting element, also referred to as a back wall, frontwardly extending end walls, frontwardly extending side walls, and inwardly extending mounting members integral with the side walls. The mounting members are used as a receptacle for modularized equipment mounting surfaces, such as shelves. The equipment mounting surfaces have a periphery defining a trough between a rear portion of the mounting surface and an interior surface of the enclosure back wall, and between a side of the mounting surface and an interior surface of an enclosure side wall. By defining the side of the mounting surface to substantially coincide with a projected plane of the inwardly extending mounting members, a cable management trough is created between the interior portion of the side walls and the side of the equipment mounting surface.

In an exemplary embodiment, a full shelf is mounted to the mounting members and the back wall. The full shelf has a top surface, a front surface, a rear surface and two side surfaces that extend beyond the top surface. The extending side surfaces have tabs that connect to slots in the back wall. By extending the side surfaces, a U-shaped trough is automatically formed between the extended portion of the side surfaces, the rear surface, and the enclosure back wall, when the full shelf is attached. The side surfaces coincide with a planar projection of the inwardly extending mounting members, wherein troughs are also formed along the enclosure side wall. The mounting connections for the mounting surfaces are made without the need of tools, thereby facilitating easy installation and maintenance of equipment mounting surfaces.

It is an advantage of an enclosure according to the principles of the invention that there are many sizes and types of mounting surfaces attachable to the enclosure, permitting use of the enclosure with a wide range of electronic equipment. Each time a mounting surface is attached, a cable management channel is automatically formed in either the back or on the sides or both, thereby providing an enclosure with modular mounting surfaces and integrated cable management.

BRIEF DESCRIPTION OF THE DRAWINGS

A more complete understanding of the invention may be obtained from consideration of the following description in conjunction with the drawings in which:

FIG. 2 is a perspective showing of an exemplary mounting surface;

DETAILED DESCRIPTION

An enclosure according to the principles of the invention provides integrated cable management using modular equipment mounting surfaces. The enclosure comprises a back wall, side walls extending inwardly from the back wall, and mounting members extending inwardly (parallel to the back wall) from the side walls. Extending side surfaces and a rear surface of the modular equipment mounting surfaces define a U-shaped periphery, wherein a cable channel is formed between the rear surface of the equipment mounting surface and an interior surface of the back wall. When mounted to the enclosure, a side surface of the mounting surface occupies a plane coinciding with a planar projection of the inwardly projecting mounting members, forming a cable management trough between the enclosure side surface and the interior of the side wall.

Figure 1:
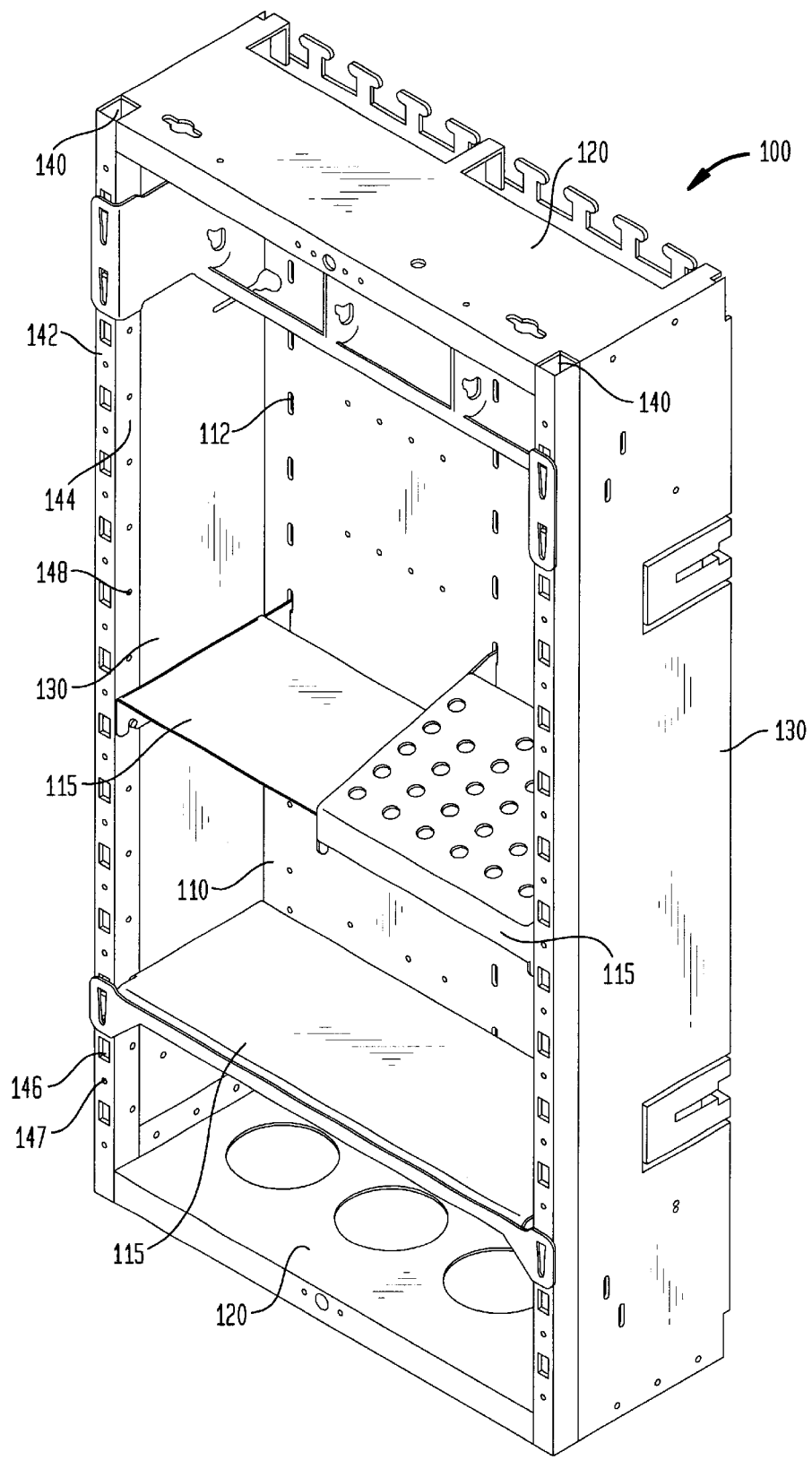
FIG. 1 is a perspective showing of an exemplary embodiment.

For illustrative purposes, an exemplary embodiment of an integrated cable and equipment mounting device is shown in FIG. 1. The integrated cable and equipment mounting device 100 has a back wall 110. The back wall defines a means for attaching a mounting surface 115 to the back wall 110. In this embodiment, the mounting means are a plurality of slots 112 arranged in three columns, although more or less columns or a different configuration of slots may be provided without departing from the principles of the invention.

A pair of end walls 120 are opposite each other and extend frontwardly from the back wall 110. The end walls 120 may be integral with the back wall 110 or may be removably attachable to the back wall 110. A pair of opposing, frontwardly extending side walls 130 attach to the back wall 110 and the end walls 120. The side walls 130 may be integral to the back wall 110 and end walls 120 or they may be removably attached. A pair of opposing mounting members 140 extend inwardly a predetermined distance from the side walls 130.

The mounting members have a front member 142 and an inside member 144 integral with the front member. In the exemplary embodiment of FIG. 1, the inside member 144 extends inwardly toward the rear wall 110 and in a plane substantially parallel to the side walls 130. The front member 142 defines a plurality of fastening apertures, including vertically spaced tab holes 146 and vertically spaced fastener holes 147. The fastener holes 147 accommodate screws or other fasteners, as is known in the art. The inside members also have a plurality of vertically spaced fastener apertures 148, similarly accommodating screws or other fasteners.

Advantageously, the mounting members 140 enable the creation of a cable management trough. By having the mounting members 140 extend inwardly as shown in FIG. 1, projected planes of the inside members 144 extend to the back wall 110. When equipment mounting surfaces 115 are mounted to the enclosure 100, a trough inherently forms between the side walls 130 and the equipment mounting surfaces. These troughs provide cable management along the side walls 130.

Figure 6A:
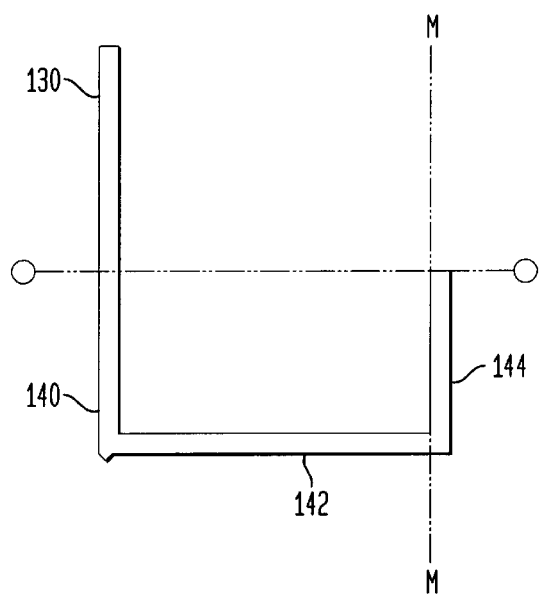
FIGS. 6A, 6B and 6C show three views of an exemplary mounting member.
Figure 6B:
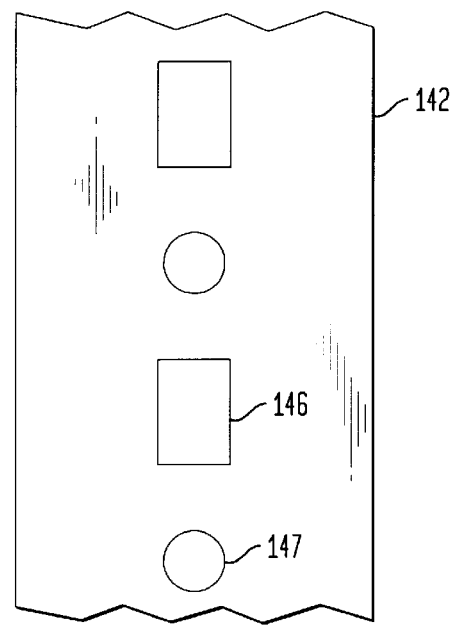
Figure 6C:
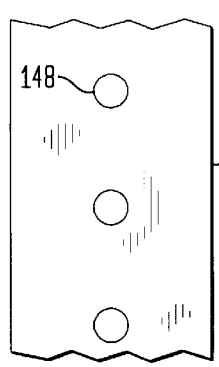

A mounting member 142 is shown more particularly with reference to FIGS. 6A, 6B and 6C. As shown in the lateral cross section of the mounting member 140 shown in FIG. 6A, the front member 142 forms an "L" with the inside member 144. Alternatively, the mounting member 142 may have a rear member (not shown) integral with the inside member 144. In this alternative embodiment, the lateral cross section of the mounting member 140 forms a "U" on the basis of the front member 142, the inside member 144, and the rear member (not shown). The mounting member connects integrally with the side wall 130 at the line o—o.

When an equipment mounting surface (not shown) is mounted, the side surface of the mounting surface extends rearward from the mounting member 140 along the plane m—m. A channel or trough is therefore defined between the side wall 130 and the side surface of the mounting surface.

FIG. 6B illustrates the front member 142 of the mounting member 140. The front member 142 defines a plurality of tab holes 146 and fastener holes 147. Such holes 146 and 147 are operable to accept mounting means from mounting surfaces (not shown). These mounting means (not shown) comprise tabs which may provide a frictional fit or snap fit. The tab holes 146 on the front members 140 can accommodate enclosure covers (not shown) as well as equipment mounting surfaces. FIG. 6C shows a view of the inner member 144 which defines further fastening holes 148.

Various mounting surfaces may be used depending upon the equipment to be mounted. FIG. 2 shows an exemplary vertical mounting bracket 200 that is removably attachable to the enclosure 100. The mounting bracket 200 has a rear surface 210, two side surfaces 220, 220 and two extending front ends 230. The two extending front ends 230 have tabs 240. With further reference to FIG. 1, the tabs 240 are designed for connecting to the vertically spaced tab holes 146 on the front members 140. While the embodiment in FIG. 2 depicts front ends 230 with two tabs 240, it is understood that the number of tabs required may vary based upon the size and strength requirements of the equipment to be mounted on the mounting surfaces 200. The side surfaces 220 coincide with the plane defined along line m—m of FIG. 6A, thereby defining a channel between the side surfaces is 220 and the side walls 130.

The mounting bracket 200 is configured such that a vertical back wall channel is formed between the rear surface 210 and the back wall 110, when the mounting bracket 200 is attached by the tabs 240 to the front member tab holes 146. The back wall channel provides cable troughs for mounted equipment. In this embodiment, the equipment cabling can pass through the side wall cable trough or through the back wall channel.

The mounting bracket 200 installs with only the tabs 240, thereby facilitating easy installation and maintenance. Alternatively, the mounting bracket 200 may be secured to the integrated cable and equipment mounting device 100 with the use of fasteners in addition to the tabs 240. Here, the opening formed by the tabs 240 are used to secure screws or other interference fasteners into the vertically spaced fastener holes 147. In addition to rigidity, the fasteners (not shown) provide a means for grounding the equipment to the enclosure 100.

Figure 3A:
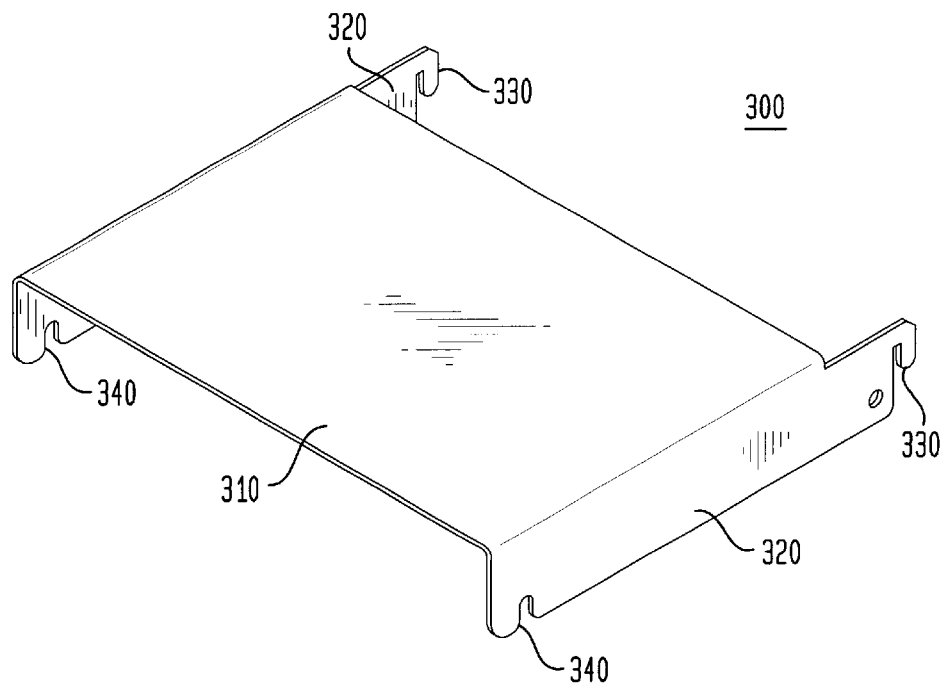
FIGS. 3A and 3B show perspectives of an exemplary mounting surface.
Figure 3B:
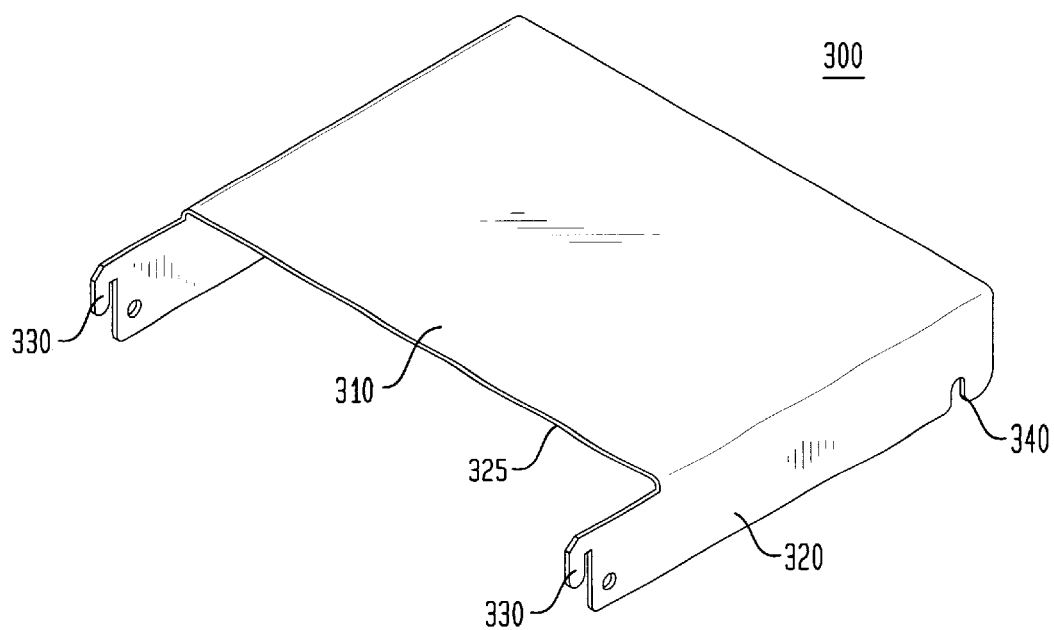
Figure 4A:
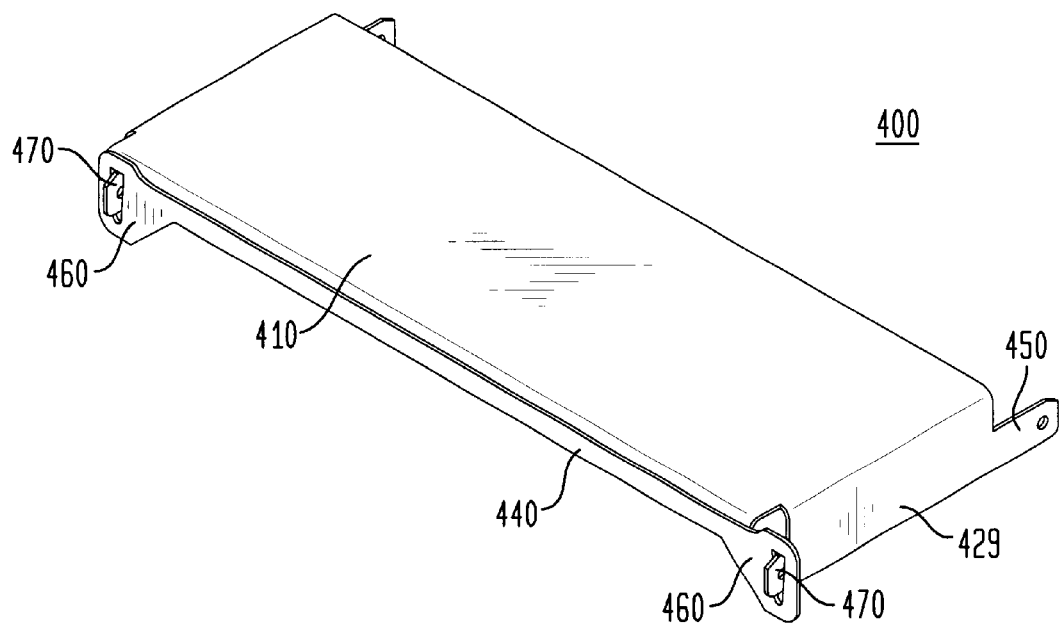
FIGS. 4A and 4B show perspectives of an exemplary mounting surface.
Figure 4B:
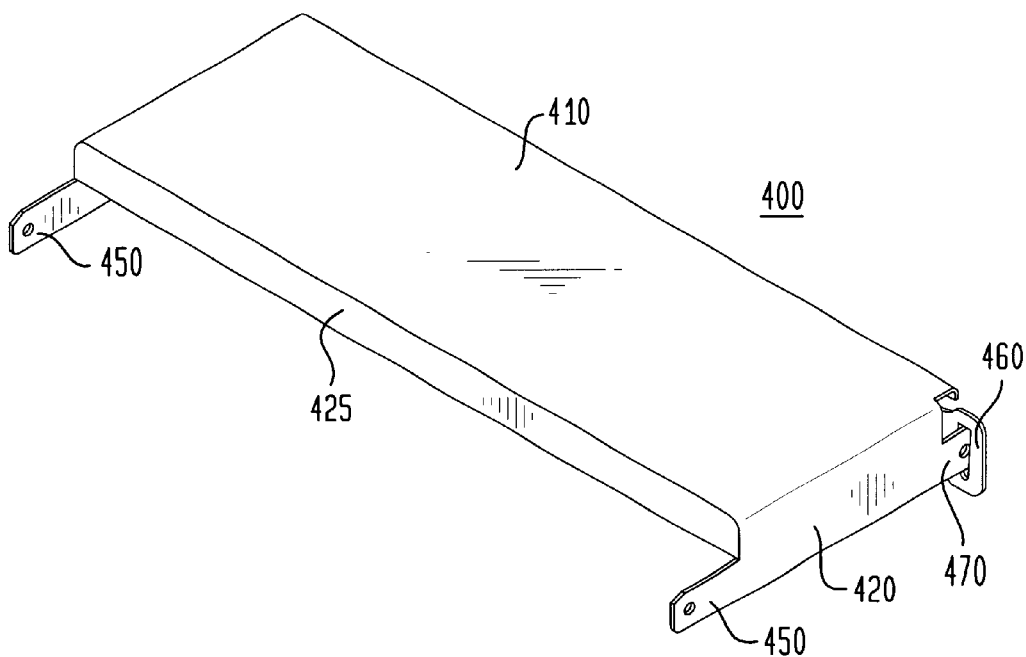

In FIGS. 3A and 3B, a half shelf 300 for use with the enclosure 100 is shown. The half shelf 300 comprises two side surfaces 320, a rear surface 325 and a top surface 310. As seen in FIG. 3B, the half shelf side surfaces 320 extend beyond the half shelf top surface 310 for forming a channel between the half shelf side surface 320, the back wall 110, and the half shelf rear surface 325. The half shelf side surfaces 320 also have tabs with slots 330 for connecting to the back wall vertically spaced slots 112, whereby the shelf is securely mounted. The half shelf side surfaces 320 also define fastener apertures 340 to provide a means for securing the half shelf 300 to the vertically spaced fastener holes 148 on one of the inside members 144. By placing the fastener holes 148 on the inside member 144 of the mounting members 140, installation of the half shelf 300 is accomplished with easy access for fastening tools. The apertures also provide means for grounding electrical equipment to the enclosure 100.

Use of the enclosure 100 with a full shelf is shown with reference FIGS. 1, 4A, 4B and 6A. The full shelf 400 has two side surfaces 420, a front wall 440, a rear surface 425 and a top surface 410 integral with the full shelf side surfaces 420 and the full shelf front wall 440. The full shelf side surfaces 420 extend beyond the full shelf top surface 410 for forming a back wall channel between the full shelf side surfaces 420, the back wall 110 of the enclosure 100, and the full shelf rear surface 425. The full shelf side surfaces 420 also have tabs 450 for connecting to the back wall vertically spaced slots 112. The full shelf front wall 440 has two extending arms 460. Each extending arm 460 has a tab 470 for connecting to the vertically spaced tab holes 146 on each respective front member 142. An opening formed by the extending arm tab 470 provides further fastening means for inserting screws or other interference fasteners into the vertically spaced fastener holes 147.

Figure 5:
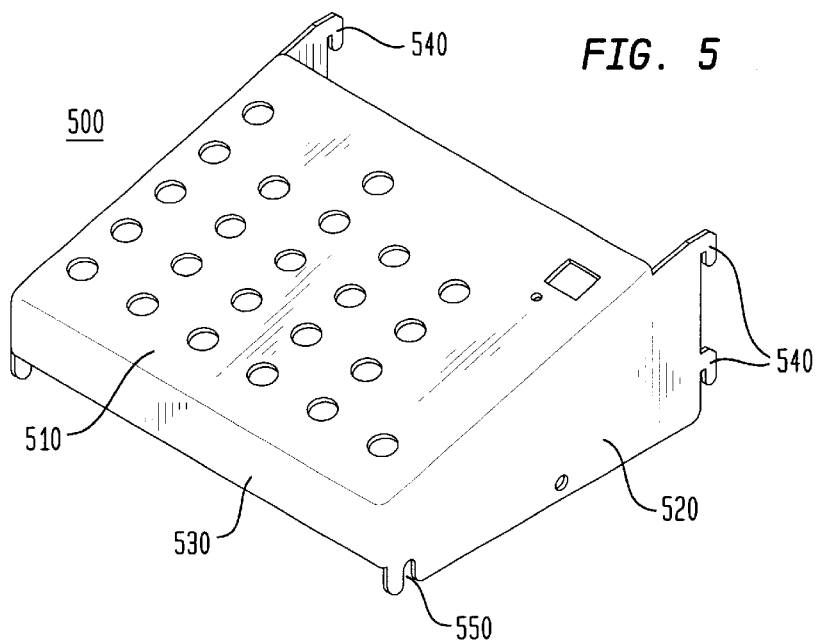
FIG. 5 is a perspective showing of an exemplary mounting surface.

Another mounting surface is shown in FIG. 5. An angled shelf 500 comprises two side surfaces 520, a front wall 530, a rear surface (not shown), and a top surface 510 integral with the angled shelf side surfaces 520 and the angled shelf front wall 530. The angled shelf side surfaces 520 angle upwardly from the angled shelf front wall 530 such that the angled shelf side surface 520 defines a width of least magnitude where it meets the angled shelf front wall 530. The angled shelf side surfaces 520 extend beyond the angled shelf top surface 510 for forming a channel between the angled shelf side surfaces 520, the angled shelf rear surface (not shown) and a back wall 110 of the enclosure 100.

The angled shelf side surfaces 520 define a plurality of tabs 540 for connecting to the back wall vertically spaced slots 112. The tabs 540 hook downward so that they create an engagement with the back wall slots 112. The angled shelf side surfaces 520 also define fastener apertures 550 to provide a means for securing the angled shelf to the vertically spaced fastener holes 148 on one of the inside members 144. This fastener can also provide a means for electrically grounding the equipment through the enclosure 100. While the embodiment in FIG. 5 depicts each side surface 520 with two tabs 540 and one fastening aperture 550, it is understood that the number of tabs 540 and apertures 550 provided may vary.

Because an enclosure according to the principles of the invention provides a plurality of front member tab holes, vertically spaced fastener holes, back wall slots, and inside member fastener holes, equipment mounting surfaces of many shapes and sizes are accommodated. When a user attaches a mounting surface to the enclosure, a cable management trough automatically defines between the mounting surface and the back wall of the enclosure and the equipment mounting surface and a side wall of the enclosure. This cable management system permits neat cable routing while providing the flexibility of a modularized enclosure.

Besides the aforementioned equipment mounting surfaces and brackets, other devices may be used with the present invention. These devices provide extending arms or members which form cable troughs with the back wall 110 when connected to the present invention. Additionally, these devices should provide fasteners which are compatible with the front member tab holes 146, the vertically spaced fastener holes 147, the back wall slots 112, and the inside member fastener holes 148.

It will be understood that the embodiment of the present invention specifically shown and described is merely exemplary and that a person skilled in the art may make alternate embodiments using different configurations and functionally equivalent components. For instance, alternative mounting surfaces may define a periphery providing cable troughs between an interior of an enclosure cover and a front surface of the mounting surface, or the cable trough may be defined between two mounting surfaces. All such alternate embodiments are intended to be included in the scope of this invention as set forth in the following claims.

What is claimed is:

1. An integrated equipment mounting and cable management device, comprising:

a mounting element comprising a back wall; and
   a mounting surface having a rear surface and a plurality of extending side surface members removably attached to said mounting element, said rear surface of said mounting surface being displaced away from said back wall, thereby forming a first cable management channel between said rear surface of said mounting surface and said back wall.

2. The device of claim 1 further comprising, said back wall having a plurality of slots, said side surface members defining at least one tab inserted into said slots.

3. The device of claim 1 further comprising:

at least one side wall extending frontwardly from said back wall; and,
   a mounting member extending inwardly from said at least one side wall a predetermined distance, at least one of said side surfaces and said side wall defining a second cable management channel, wherein said second cable management channel has a width substantially the same as said predetermined distance.

4. An integrated equipment mounting and cable management device, comprising:

a mounting element comprising a back wall;
   at least one side wall extending frontwardly from said back wall; and,
   a mounting member extending inwardly from said at least one side wall a predetermined distance, said mounting member having a front member, said front member defining a plurality of fastening apertures; and
   a mounting surface having attachment means for removably attaching said mounting surface to said mounting member, a side surface, and a rear surface located so as to be displaced away from said back wall, said rear surface and said back wall defining a first cable management channel, and said side surface and said side wall defining a second cable management channel, wherein said second cable management channel has a width substantially the same as said predetermined distance.

5. The device of claim 4 wherein said mounting element and said side wall are integrally attached.

6. The device of claim 4 wherein said attachment means comprises a front surface having extending members, said extending members defining at least one tab inserted into said fastening apertures, wherein said mounting surface is removably attached to said front member.

7. The device of claim 4 wherein said attachment means comprises a front surface having extending members, said extending members defining at least one aperture, wherein an attaching means is inserted in said at least one aperture and said fastening aperture to removably attach said mounting surface to said front member.

8. The device of claim 7 wherein said attaching means comprises a screw.

9. The device of claim 4 wherein said mounting surface further comprises a plurality of extending side surface members removably attached to said mounting element, said rear surface, said side surface members and said mounting element defining a cable management channel.

10. The device of claim 9, said mounting element having a plurality of slots, said side surface members defining at least one tab inserted into said slots, wherein said side surface members are removably attached to said mounting element.

11. The device of claim 4 wherein said mounting surface is selected from the group comprising a full shelf, a half shelf, a vertical mounting surface, and an angled shelf.

12. The device of claim 4 wherein said mounting members further comprise an inside member extending backwardly from said front member, said inside member defining a plurality of inside fastening apertures, and said side surface defining a side surface fastening aperature.

13. The device of claim 12 further comprising an inside attaching means inserted through one of said inside fastening apertures and said side surface aperture, wherein said mounting surface is removably attached to said inside member.

14. The device according to claim 4, wherein said mounting members is of an "L" shape in lateral cross section.

15. The device according to claim 4, wherein said mounting member is further comprised of a rear member extending from said inside member, said mounting member being of an "U" shape in lateral cross section.

16. The device according to claim 4 further comprising an electrically conducting grounding piece attachable to the device.

\* \* \* \* \*